(12) United States Patent
Sohn

(10) Patent No.: US 7,456,676 B2
(45) Date of Patent: Nov. 25, 2008

(54) CHARGE PUMP CIRCUIT FOR SEMICONDUCTOR MEMORY DEVICE

(75) Inventor: Young-Soo Sohn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 11/350,868

(22) Filed: Feb. 10, 2006

(65) Prior Publication Data
    US 2006/0181938 A1    Aug. 17, 2006

(30) Foreign Application Priority Data
    Feb. 17, 2005    (KR) .................... 10-2005-0013050

(51) Int. Cl.
    *H03L 5/00*    (2006.01)
(52) U.S. Cl. .................... 327/333; 327/536; 327/537
(58) Field of Classification Search .................... 327/52,
    327/55, 562, 563, 333.335, 148, 157, 543–537,
    327/333; 326/63, 68, 80, 81; 330/252, 253
    See application file for complete search history.

(56) References Cited
U.S. PATENT DOCUMENTS

| | | | |
|---|---|---|---|
| 6,191,623 B1 * | 2/2001 | Gabara | .................... 327/71 |
| 6,747,494 B2 | 6/2004 | Bushey et al. | |
| 6,747,506 B1 | 6/2004 | Thiara | |
| 7,057,421 B2 * | 6/2006 | Shi et al. | .................... 327/55 |
| 7,279,939 B2 * | 10/2007 | Burleson et al. | .................... 327/51 |
| 2004/0160244 A1 * | 8/2004 | Kim | .................... 327/55 |
| 2006/0049852 A1 * | 3/2006 | Park et al. | .................... 327/55 |
| 2006/0132191 A1 * | 6/2006 | Palmer | .................... 327/52 |

* cited by examiner

*Primary Examiner*—N. Drew Richards
*Assistant Examiner*—John W Poos
(74) *Attorney, Agent, or Firm*—Harness, Dickey & Pierce

(57) ABSTRACT

A charge pump circuit may include a cross-coupled load unit and a bias determination unit. The cross-coupled load unit may receive first and second input signals applied with mutually opposite phases to obtain a charge pumping. The cross-coupled load unit may have first and second output terminals that may be connected with transistors in a cascade connection structure. The bias determination unit may have a current mirror structure, and independently determine biases of a transistor among the cascade structure connected transistors in response to voltages of the first and second output terminals.

19 Claims, 6 Drawing Sheets

US 7,456,676 B2

CHARGE PUMP CIRCUIT FOR SEMICONDUCTOR MEMORY DEVICE

PRIORITY STATEMENT

A claim of priority is made to Korean Patent Application 2005-13050 filed on Feb. 17, 2005, the entire contents of which are hereby incorporated by reference.

FIELD OF THE INVENTION

Example embodiments of the present invention relate to a semiconductor memory device. More particularly, example embodiments of the present invention relate to a charge pump circuit for a semiconductor memory device.

BACKGROUND OF THE INVENTION

A volatile semiconductor memory device such as a Dynamic Random Access Memory (DRAM) or Static Random Access Memory (SRAM) may include a high voltage generating circuit. The high voltage generating circuit may be used, for example, during a wafer burn-in test, driving a word line in a DRAM in a normal operating mode, or compensating threshold voltage loss caused by an N-type MOS transistor. The burn-in test may be an accelerated test, which may apply, for a determined time, a voltage stress or temperature stress higher than normal environment operation conditions to a semiconductor memory device. Electrical characteristics of a semiconductor memory device may be evaluated after applying the stresses, thereby screening weak and/or bad cells.

To generate a voltage to drive a word line or a stress voltage, a high voltage VPP having a level higher than a normal power source voltage VDD may be required. A higher voltage may be generated by a high voltage generating circuit configured within a semiconductor memory device.

A high voltage generating circuit may be constructed of a ring oscillator, a charge pump, or a level detector. A level detector may compare a feed-back high voltage VPP with a reference voltage Ref, and may output a detection signal that provides a level increase or decrease of the high voltage VPP. A ring oscillator may generate pumping clocks CK,/CK corresponding to a detection signal output from the level detector. A charge pump may output a high voltage VPP traced to the reference voltage Ref through charge pumping operation responding to the pumping clocks.

FIG. 1 is a circuit diagram of a charge pump 11 in a high voltage generator of the prior art. FIG. 1 illustrates a circuit configuration of a cross-coupled charge pump, which may include two capacitors C1 and C2, four P-type MOS transistors P1-P4, and three N-type MOS transistors N1-N3. The charge pump may be used to obtain a split output characteristic in order to correct a duty ratio of clock signals. Such cross-coupled charge pump may be known as a boosting circuit of two inputs/outputs, and may be used as a duty detector within a duty compensation circuit (DCC) for clock signals. The cross-coupled charge pump may be known to have simple, reliable and/or high performing characteristics.

In the circuit illustrated in FIG. 1, a split of output voltage may increase when a duty of input clock signal is over 50%; and a split of output voltage may not increase when a duty of input clock signal approaches 50%. The reason why the split of output voltage is represented on both output terminals may be due to a difference of current flowing through both output terminals (out, outb) caused by stored charge amounts of pumping capacitors C1 and C2.

For a duty detector to perform a function, a split performance of the charge pump may become an important performance reference for a charge pump circuit, and the split performance may be limited by various error factors.

If a split is generated at both output terminals (out and outb) of the charge pump circuit, voltages for a load may become different, therefore, there may be a difference in drain-source voltages Vds of cross-coupled P-type MOS transistors P2 and P3. This may be provided by a current difference, and currents of output nodes become equal even though a duty of input signal is not 50%. In other words, if an output impedance is relatively low, output voltages of both output terminals may not split. Also, if an output impedance of output load is low, currents flowing through both output nodes may become equal and so a split of output voltage may be stopped. Thus, to increase the output impedance in the circuit of FIG. 1, a length of a gate of load transistors may have to be longer. The increase in the gate may cause a larger area to be occupied and may create integration limitations.

FIG. 2 is a graph illustrating a split characteristic of an output voltage based on a length of a gate. A transverse axis indicates time, and a longitudinal axis indicates voltage. Graphs G1 and G4 individually indicate split curves represented in both output terminals when a gate length of a load transistor is lengthened, and G2 and G3 individually provide split curves represented in both output terminals when a gate length of load transistor is relatively short. For example, when a signal having a duty of 49.5% is applied as a differential input to the circuit of FIG. 1, an output split of the charge pump becomes continuously wider as shown in the graphs G1 and G4 in the case that a load gate length may be relatively long, while in the case the gate length may be relatively short, the split may be stopped at a given time point as shown in the graphs G2 and G3. To increase an output impedance in the charge pump circuit of the prior art, a gate length of cross-coupled load transistor should be relatively long, but the length may cause a limitation in integration of semiconductor memory devices.

SUMMARY OF THE INVENTION

In an example embodiment of the present invention, a charge pump circuit in a semiconductor memory device may include a cross-coupled load unit configured to receive first and second input signals applied with mutually opposite phases to obtain a charge pumping. The cross-coupled load unit may have first and second output terminals that are connected to transistors having a cascade connection structure. A bias determination unit may be configured to independently determine biases a transistor among the cascaded structured transistors in response to voltages of the first and second output terminals.

BRIEF DESCRIPTION OF THE DRAWINGS

The present invention will be more apparent with the description of example embodiments thereof and the accompanying drawings in which like reference characters refer to similar parts, in which.

DESCRIPTION OF EXAMPLE EMBODIMENTS OF THE INVENTION

Figure 1:
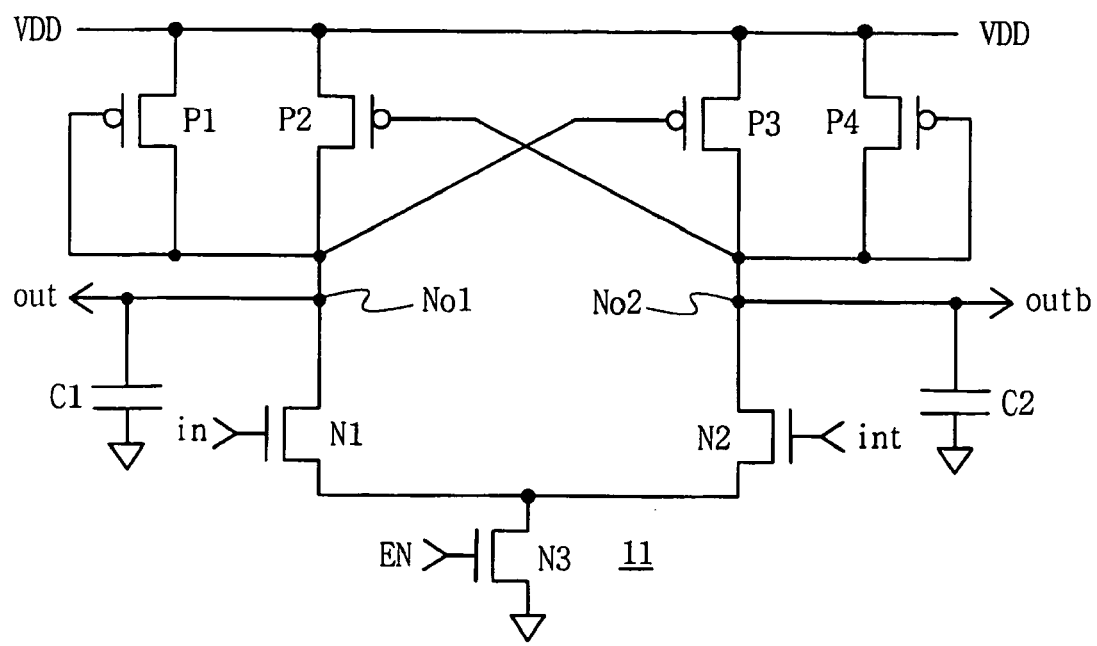
FIG. 1 is a circuit diagram of a charge pump according to the prior art.
Figure 2:
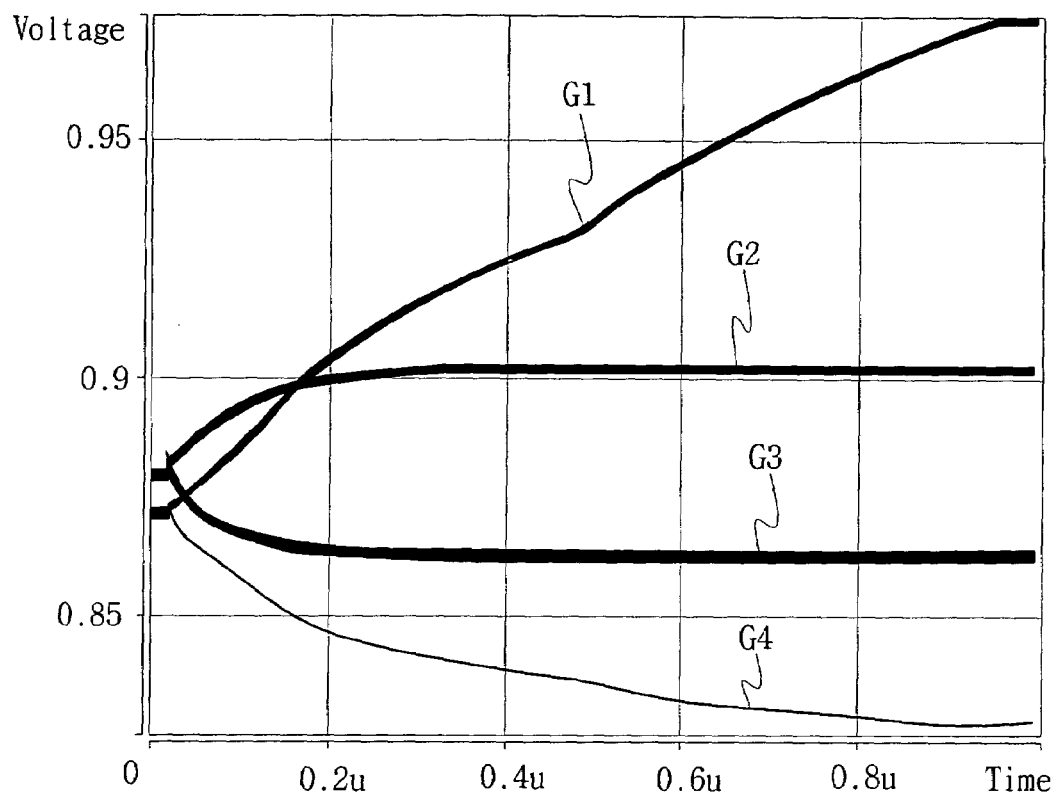
FIG. 2 is a graph illustrating a split characteristic of an output voltage of the circuit shown in FIG. 1.

Example embodiments of the present invention will be described below with reference to FIGS. 3 to 5 in which like reference characters refer to the similar parts.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, the example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
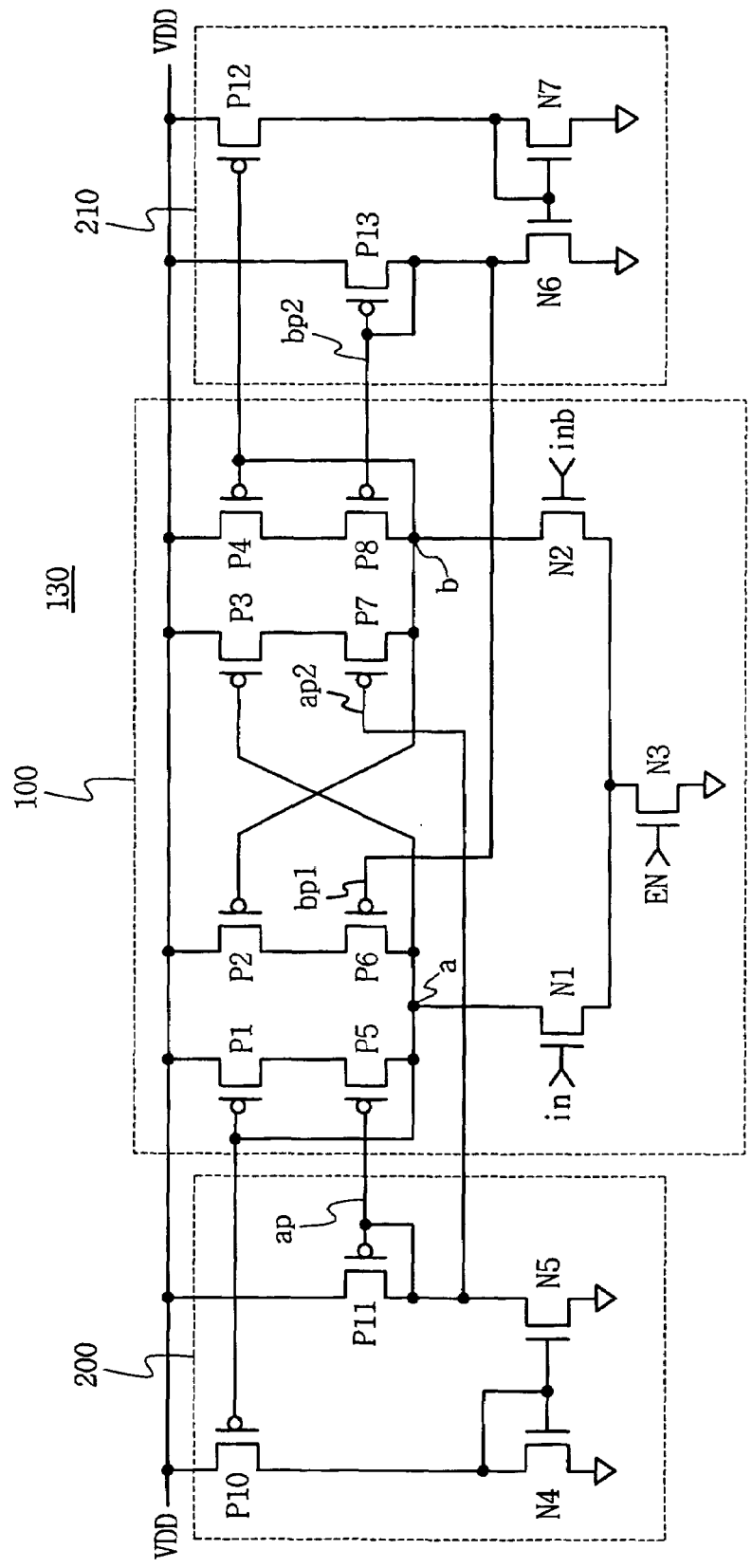
FIG. 3 is a circuit diagram of a charge pump according to an example embodiment of the invention present.

FIG. 3 illustrates a circuit diagram of a charge pump according to an example embodiment of the present invention. Referring to FIG. 3, four P-type MOS transistors P5-P8 may be connected with each another in a cascade connection structure in a cross-coupled load unit 100. The first bias determination unit 200 may include two P-type P10, P11 and two N-type MOS transistors N4, N5. The second bias determination unit 210 may include two P-type P12, P13 and two N-type MOS transistors N6, N7. The P-type MOS transistors P5 and P8 may be connected to the P-type MOS transistors P11 and P13, respectively, of the first and second bias determination units 200 and 210.

The charge pump circuit illustrated in FIG. 3 may include the cross-coupled load unit 100 configured to receive first and second input signals (in, inb) having mutually opposite phases to obtain a charge pumping. The cross-coupled load unit 100 may have first and second output terminals (a, b) that may be connected with transistors P5-P8 having a cascade connection structure. The bias determination units 200 and 210 may independently determine a bias of corresponding transistors P5-P8 in response to voltages of the first and second output terminals (a, b). The bias determination units 200 and 210 may have a current mirror structure.

In FIG. 3, each pumping capacitor (not shown) may be connected to each of the first and second output terminals (a, b). A connection configuration of transistors constituting the charge pump circuit of FIG. 3 will be described in further detail as follows.

The cross-coupled load unit 100 may further include: first, second, third and fourth P-type MOS transistor P1, P2, P3 and P4, wherein respective sources may be commonly connected to a power source voltage VDD; fifth and sixth P-type MOS transistors P5 and P6, which each may have a cascade connection structure with the first and second P-type MOS transistors P1 and P2, and respective drains may be individually connected to the first output terminal (a); seventh and eighth P-type MOS transistors P7 and P8, which each may have a cascade connection structure with the third and fourth P-type MOS transistors P3 and P4, and respective drains may be individually connected to the second output terminal (b); first and second N-type MOS transistors N1 and N2, which may be used for input, wherein first and second N-type MOS transistors N1 and N2 may receive first and second input signals (in, inb), respectively, through their respective gates, and wherein their respective drains may be individually connected to the first and second output terminals (a, b); tenth and eleventh P-type MOS transistors P10 and P11 of the first bias determination unit 200, which may be used for first biasing, of which respective sources may be commonly connected to the power source voltage VDD; fourth and fifth N-type MOS transistors N4 and N5, which may be used for first biasing, of which drains are individually connected to each drain of the tenth and eleventh P-type MOS transistors P10 and P11, and of which gates are connected with each other; twelfth and thirteenth P-type MOS transistors P12 and P13 of the second bias determination unit 210, which may be used for second biasing, of which sources are connected to a power source voltage; and sixth and seventh N-type MOS transistors N6 and N7, which may be used for a second biasing, of which drains are individually connected to each drain of the twelfth and thirteenth P-type MOS transistors P12 and P13 for the second biasing, and of which gates are connected with each other.

The first, second, third and fourth P-type MOS transistors P1-P4 may be respectively cascade connected to corresponding the fifth, sixth, seventh and eighth P-type MOS transistors P5-P8. A gate of the second P-type MOS P2 transistor may be connected to a drain of the seventh P-type MOS transistor P7; a gate of the third P-type MOS transistor P3 may be connected to a drain of the sixth P-type MOS transistor P6, thereby forming a cross-coupled charge pump. Gates of the fifth and seventh P-type MOS transistors P5 and P7 may be connected to a gate of the eleventh P-type MOS transistor P11 for the first biasing. Gates of the sixth and eighth P-type MOS transistors P6 and P8 may be connected to a gate of the thirteen P-type MOS transistor P13 for the second biasing. A gate of the first P-type MOS transistor P1 may be coupled with both the first output terminal (a) and a gate of the tenth P-type MOS transistor P10 for the first biasing. A gate of the fourth P-type MOS transistor P4 may be coupled with both the second output terminal (b) and a gate of the twelfth P-type MOS transistor P12 for the second biasing. The eleventh and thirteen P-type MOS transistors P11 and P13 and the fourth and fifth N-type MOS transistors N4 and N5 for the first and second biasing may be a diode-connection transistor. The first and fourth P-type MOS transistors P1 and P4 may be diode transistors operationally having a diode function.

An equivalent resistance (ro) for the output terminal (a) may be "gm*ro*ro" with an additional connection and independent biasing of the fifth to eighth P-type MOS transistors P5-P8, which function as cascade transistors. In other words, an output impedance increases by a gain "gm*ro" of the cascade transistors through the cascade connection structure. In this case, of course, the cascade transistors P5-P8 may be manufactured in a stack structure for the first to fourth P-type MOS transistors P1-P4, thus receiving a bias voltage, independently from the first to fourth P-type MOS transistors P1-P4.

Applying voltage to gates of the cascade transistors P5-P8 for a bias operation may be performed through first and second bias determination unit 200 and 210.

In the first bias determination unit 200, if a width of a gate of the tenth P-type MOS transistor P10 for a first biasing is W, a width of a gate of the eleventh P-type MOS transistor P11 may be W/4. An output impedance may increase when a level of voltage applied to a gate of the fifth P-type MOS transistor P5 is lower than a voltage level applied to a gate of the first P-type MOS transistor P1. In this case, voltages Vgs of gates and sources of the first and fifth P-type MOS transistors may become mutually equal. Further, a first bias voltage (ap) represented on a gate of the eleventh P-type MOS transistor P11 may also be applied to a gate of the seventh P-type MOS transistor P7.

The configuration and operation of the second bias determination unit 210 may be similar to the first bias determination unit 200, therefore, detail descriptions thereof will be omitted.

Bias voltages of cascade transistors P5 and P7 may be independently provided by using the eleventh P-type MOS transistor P11 having a size ¼ of the tenth P-type MOS transistor P10. A split performance of cross-coupled type charge pump may improve without having to increase a length of a gate on the basis of an increased output impedance of an output terminal.

Figure 6:
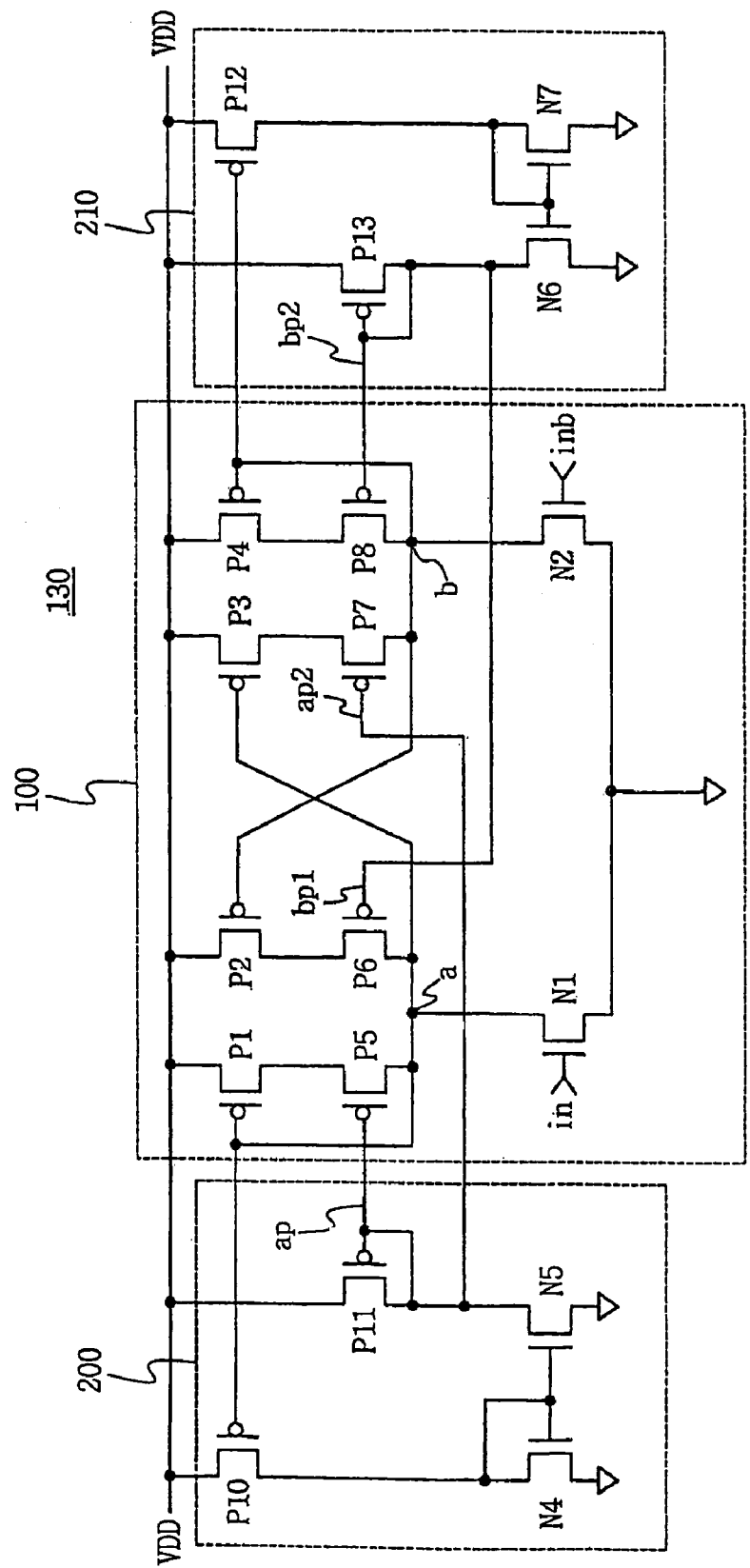
FIG. 6 illustrates a circuit diagram of a charge pump that includes a differential input portion shown as a folded type.

FIG. 6 illustrates a circuit diagram of a charge pump that includes a differential input portion shown as a folded type. Referring to FIG. 6, a differential input portion may be changed to a folded type. In other words, when the folded input structure of the differential input portion is obtained by removing an N-type MOS transistor N3 in FIG. 3 and by performing a direct connection with a ground; the same output range as an active range of FIG. 1 may be obtained.

Figure 4:
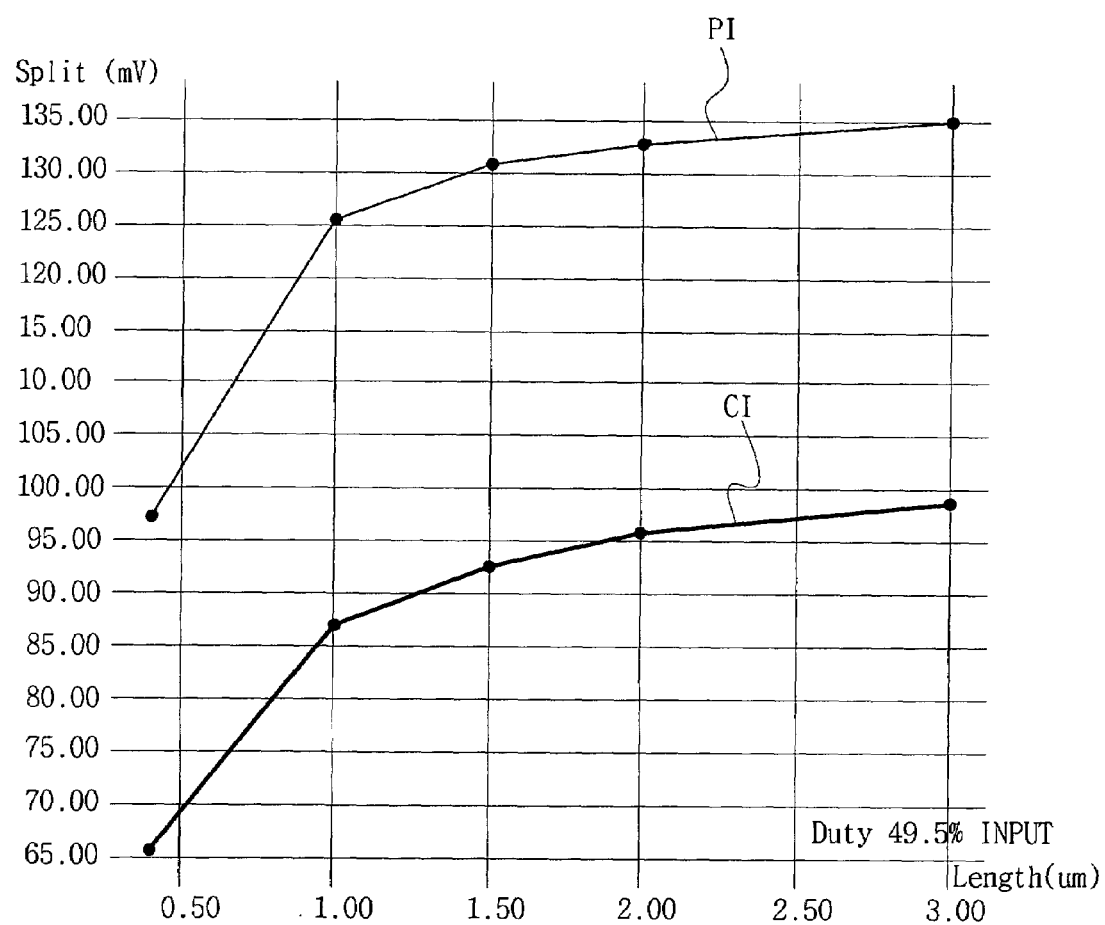
FIG. 4 is a graph illustrating an example split characteristic of an output voltage of the circuit shown in FIG. 3.

FIG. 4 is a graph illustrating a split simulation result of a charge pump of FIG. 3. A transverse axis indicates a length of a gate, and a longitudinal axis indicates a split performance in a voltage type. In a conventional charge pump circuit, when a duty of 49.5% is applied to a differential charge pump, the split does not reach 100 mV, even if a length of a gate may be increased. In an example embodiment of the present invention, an output over 100 mV is split even if a relatively short gate length is used. In FIG. 4, a graph PI indicates an example embodiment of the present invention and a graph CI indicates a conventional charge pump.

Figure 5:
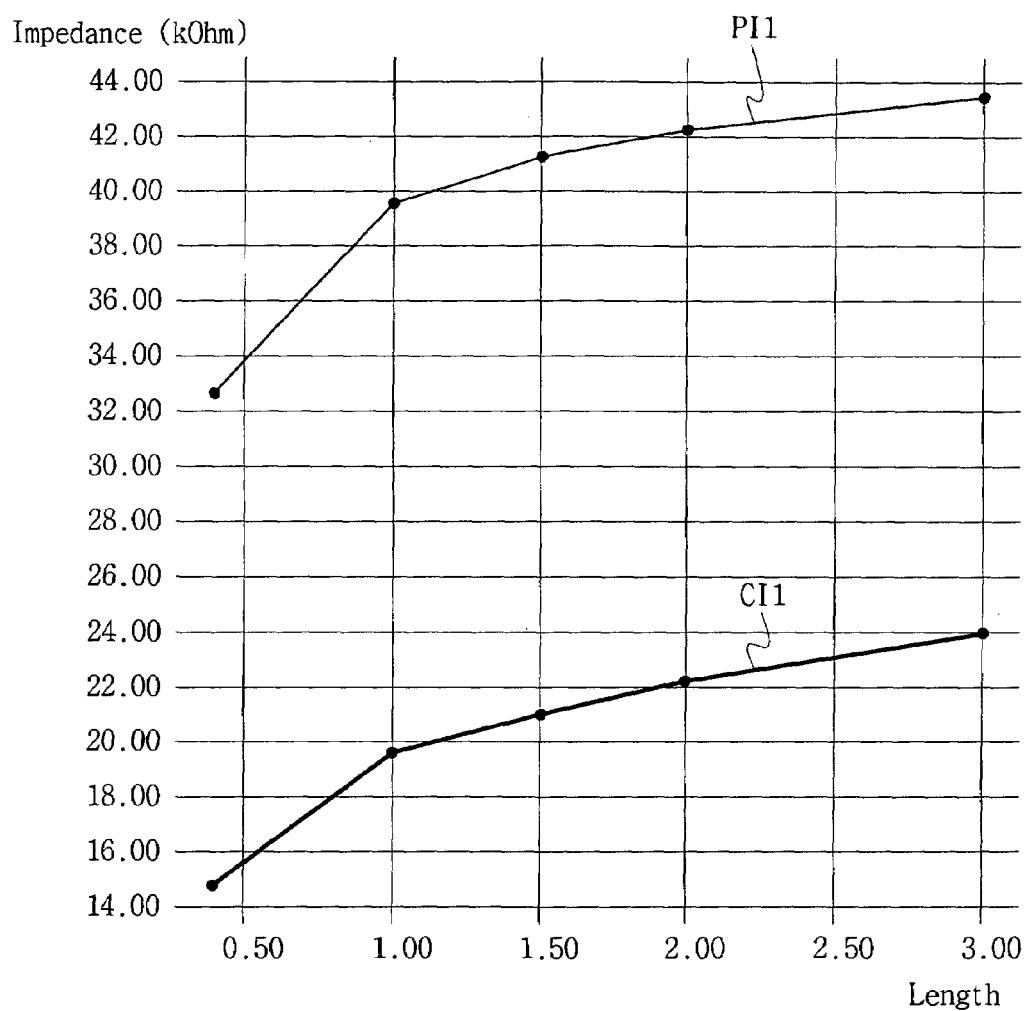
FIG. 5 is a graph illustrating an example differential output impedance characteristic in the circuit shown in FIG. 3.

FIG. 5 illustrates an output impedance measured based on a length of a gate. As shown in FIG. 5, an output impedance according to an example embodiment of the present invention as shown by graph PI1 is at least two or more times greater than a an output impedance of a conventional charge pump as shown by graph CI1.

In a charge pump circuit according to example embodiments of the present invention, an output impedance of output terminal may be heightened without increasing a length of a gate of transistors constituting a cross-coupled load by cascade transistors and bias determining units.

As described above, in a charge pump circuit of a semiconductor memory device according to an example embodiment of the invention, an output impedance of output terminal may become high without increasing a length of gate of transistors of a cross-coupled load, thus a split performance of output voltage may be improved.

It will be apparent to those skilled in the art that modifications and variations may be made to the example embodiments without deviating from the scope of the present invention. Thus, it is intended that the example embodiments of the present invention cover any such modifications and variations provided they come within the scope of the example embodiment of the present invention.

What is claimed is:

1. A charge pump circuit in a semiconductor memory device, the circuit comprising:
   a cross-coupled load unit configured to receive first and second input signals applied with mutually opposite phases, the cross-coupled load unit having first and second output terminals connected to transistors in a cascade connection structure; and
   a bias determination unit configured to independently determine biases of the cascaded structured transistors in response to voltages of the first and second output terminals, wherein the bias determination unit is configured to have a current mirror structure.

2. The circuit of claim 1, wherein the first and second output terminals are a differential output type.

3. The circuit of claim 1, wherein a structure of input terminals of the first and second input signals are a folded type.

4. The circuit of claim 1, wherein the cross-coupled load unit includes:
   first, second, third and fourth P-type Metal Oxide Semiconductor (MOS) transistors having sources thereof connected to a power source voltage; and the cascaded structure of transistors include fifth, sixth, seventh, and eighth P-type MOS transistors, and wherein the fifth and sixth P-type MOS transistors are configured to have a cascade connection structure with the first and second P-type MOS transistors and configured to have their respective drains connected to the first output terminal, and the seventh and eighth P-type MOS transistors are configured to have a cascade connection structure with the third and fourth P-type MOS transistors and configured to have their respective drains connected to the second output terminal.

5. The circuit of claim 4, wherein the bias determination unit includes a first bias determination unit and a second bias determination unit.

6. The circuit of claim 5, wherein the first bias determination unit includes:
   tenth and eleventh P-type MOS transistors for a first biasing, wherein sources of the tenth and eleventh P-type MOS transistors are configured to connect to the power source voltage to determine a first bias voltage; and
   fourth and fifth N-type MOS transistors, wherein drains of the fourth and fifth N-type MOS transistors are configured to connect to drains of the tenth and eleventh P-type MOS transistors, respectively, and wherein gates of the fourth and fifth N-type MOS transistors are connected with each other.

7. The circuit of claim 6, wherein a gate of the tenth P-type MOS transistor is connected to a gate of the first P-type MOS transistor, and a gate of the eleventh P-type MOS transistor is connected to a fifth P-type MOS transistor.

8. The circuit of claim 6, wherein a gate size of the eleventh P-type MOS transistor is about ¼ smaller than a gate size of the tenth P-type MOS transistor.

9. The circuit of claim 5, wherein the second bias determination unit includes:
   twelfth and thirteenth P-type MOS transistors for a second biasing, wherein sources of the twelfth and thirteenth P-type MOS transistors are configured to connect to the power source voltage to determine a second bias voltage; and
   sixth and seventh N-type MOS transistors, wherein drains of the sixth and seventh N-type MOS transistors are configured to connect drains of the twelfth and thirteenth P-type MOS transistors, respectively, and wherein gates of the sixth and seventh N-type MOS transistors are connected to each other.

10. The circuit of claim 9, wherein the second bias voltage has a level lower than a voltage of the second output terminal.

11. The circuit of claim 9, wherein a gate of the twelfth P-type MOS transistor is connected to a gate of the fourth P-type MOS transistor, and a gate of the thirteenth P-type MOS transistor is connected to a gate of the eight P-type MOS transistor.

12. The circuit of claim 5, wherein the first bias determination unit and the second bias determination unit are adapted to independently determine biases of corresponding transistors among the cascaded structured transistors in response to voltages of the first and second output terminals.

13. The circuit of claim 12, wherein the cross-coupled load unit includes:
   first, second, third and fourth P-type Metal Oxide Semiconductor (MOS) transistors having sources thereof connected to a power source voltage, and the cascaded structure transistors include fifth, sixth, seventh, and eighth P-type MOS transistors, and wherein
   the fifth and sixth P-type MOS transistors are configured to have a cascade connection structure with the first and second P-type MOS transistors and configured to have their respective drains connected to the first output terminal, and the seventh and eighth P-type MOS transistors are configured to have a cascade connection structure with the third and fourth P-type MOS transistors and configured to have their respective drains connected to the second output terminal.

14. The circuit of claim 12, wherein the first bias determination unit includes:
   tenth and eleventh P-type MOS transistors for a first biasing, wherein sources of the tenth and eleventh P-type MOS transistors are configured to connect to the power source voltage to determine a first bias voltage; and
   fourth and fifth N-type MOS transistors, wherein drains of the fourth and fifth N-type MOS transistors are configured to connect to drains of the tenth and eleventh P-type MOS transistors, respectively, and wherein gates of the fourth and fifth N-type MOS transistors are connected with each other.

15. The circuit of claim 14, wherein a gate of the tenth P-type MOS transistor is connected to a gate of the first P-type MOS transistor, and a gate of the eleventh P-type MOS transistor is connected to a fifth P-type MOS transistor.

16. The circuit of claim 12, wherein the second bias determination unit includes:
   twelfth and thirteenth P-type MOS transistors for a second biasing, wherein sources of the twelfth and thirteenth P-type MOS transistors are configured to connect to the power source voltage to determine a second bias voltage; and
   sixth and seventh N-type MOS transistors, wherein drains of the sixth and seventh N-type MOS transistors are configured to connect drains of the twelfth and thirteenth P-type MOS transistors, respectively, and wherein gates of the sixth and seventh N-type MOS transistors are connected to each other.

17. The circuit of claim 16, wherein a gate of the twelfth P-type MOS transistor is connected to a gate of the fourth P-type MOS transistor, and a gate of the thirteenth P-type MOS transistor is connected to a gate of the eight P-type MOS transistor.

18. The circuit of claim 12, wherein the bias determination unit includes first, second, and third N-type Metal Oxide Semiconductor (MOS) transistors, wherein the first and second N-type MOS transistors are configured to receive the first and second input signals, respectively, their respective sources are connected to the first and second output terminals, and their respective drains are connect to a source of the third N-type MOS transistor.

19. The circuit of claim 1, wherein the bias determination unit includes first, second, and third N-type Metal Oxide Semiconductor (MOS) transistors, wherein the first and second N-type MOS transistors are configured to receive the first and second input signals, respectively, their respective sources are connected to the first and second output terminals, and their respective drains are connect to a source of the third N-type MOS transistor.

* * * * *